(12) United States Patent
Weaver et al.

(10) Patent No.: US 7,019,244 B2
(45) Date of Patent: Mar. 28, 2006

(54) ELECTROSTATIC PRECIPITATOR

(75) Inventors: Jeffrey S. Weaver, Fort Collins, CO (US); Samuel M. Babb, Fort Collins, CO (US); Kelly J. Pracht, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 226 days.

(21) Appl. No.: 10/126,635

(22) Filed: Apr. 20, 2002

(65) Prior Publication Data

US 2003/0221999 A1    Dec. 4, 2003

(51) Int. Cl.
 *B03C 7/00* (2006.01)
(52) U.S. Cl. .............. 209/127.1; 96/77; 96/95
(58) Field of Classification Search .......... 96/77 X, 96/95 X, 97 X; 95/79, 78; 209/127.1, 129; 361/676, 677, 678, 688–691
See application file for complete search history.

(56) References Cited

U.S. PATENT DOCUMENTS

| | | | | |
|---|---|---|---|---|
| 3,124,720 A * | 3/1964 | Green | ............... | 361/691 |
| 3,648,113 A * | 3/1972 | Rathjen et al. | ............. | 361/707 |
| 3,956,673 A * | 5/1976 | Seid | ............. | 361/690 |
| 4,534,776 A * | 8/1985 | Mammel et al. | ............. | 96/75 |
| 4,665,707 A * | 5/1987 | Hamilton | ............. | 62/3.3 |
| 6,056,808 A * | 5/2000 | Krause | ............. | 96/24 |
| 6,294,003 B1 * | 9/2001 | Ray | ............. | 96/49 |
| 6,616,524 B1 * | 9/2003 | Storck et al. | ............. | 361/678 |
| 2004/0257766 A1 * | 12/2004 | Rasmussen et al. | ......... | 361/689 |

* cited by examiner

*Primary Examiner*—Donald P. Walsh
*Assistant Examiner*—Joseph Rodriguez

(57) ABSTRACT

An electrostatic precipitator that removes zinc whiskers from cooling air provided to cool components in an electronics enclosure. The electrostatic precipitator comprises an ionizer configured to apply a charge to zinc whiskers suspended in the cooling air. The electrostatic precipitator also comprises a collector that collects charged zinc whiskers from the contaminated cooling air to generate uncontaminated cooling air for cooling the components of the electronics enclosure. The electrostatic precipitator is configured to be disposed in the cooling air flow path upstream of the components such that the cooling air travels through the electrostatic precipitator prior to impinging on the components.

18 Claims, 8 Drawing Sheets

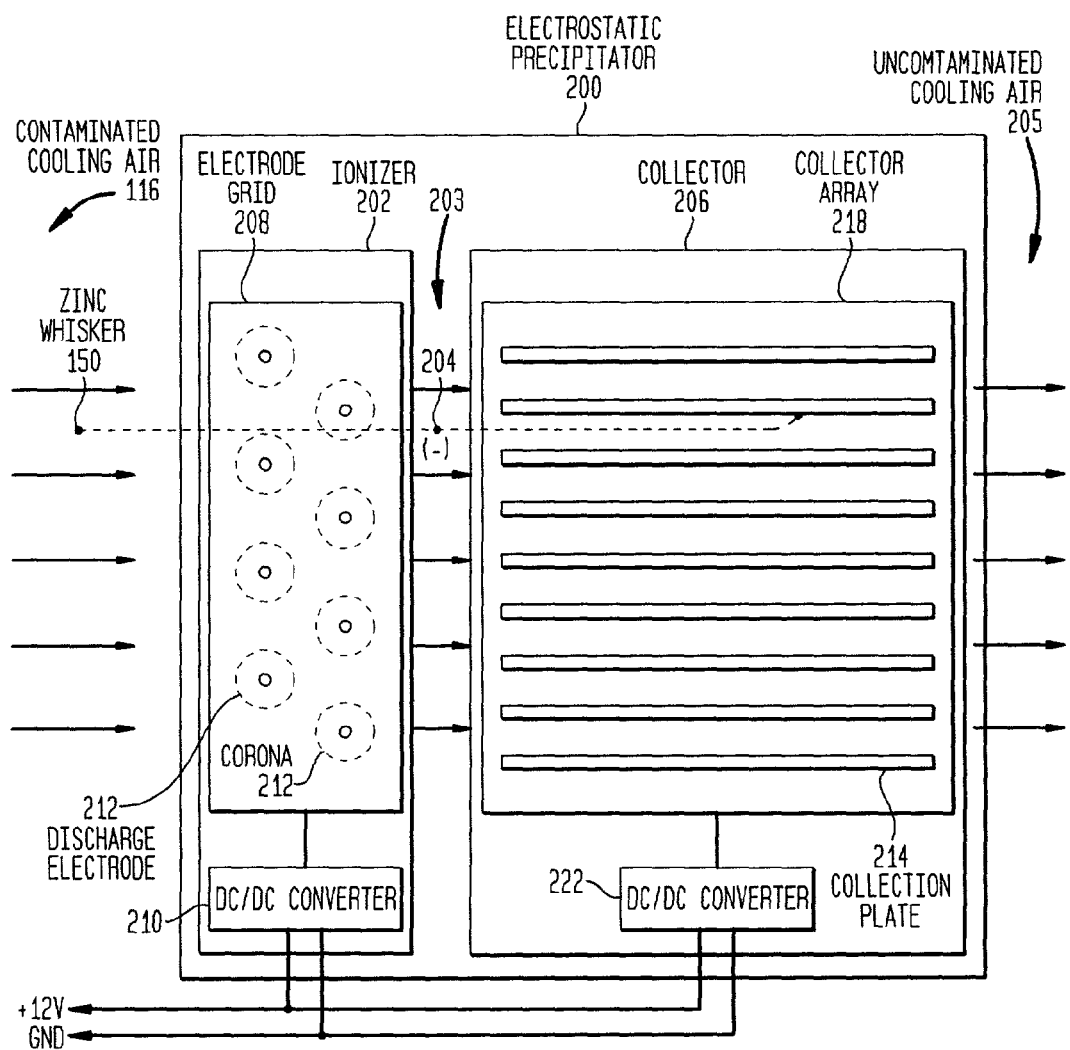

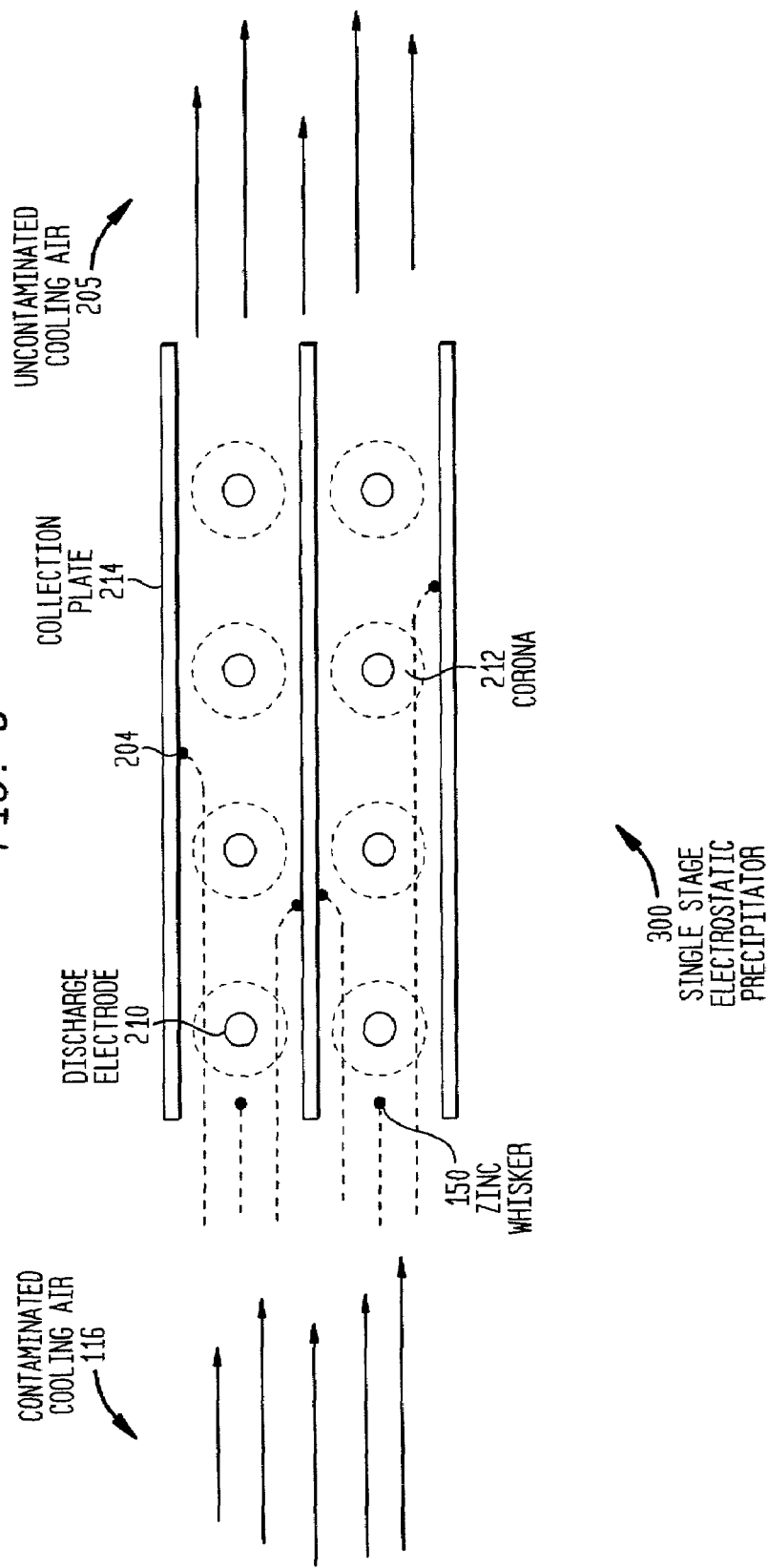

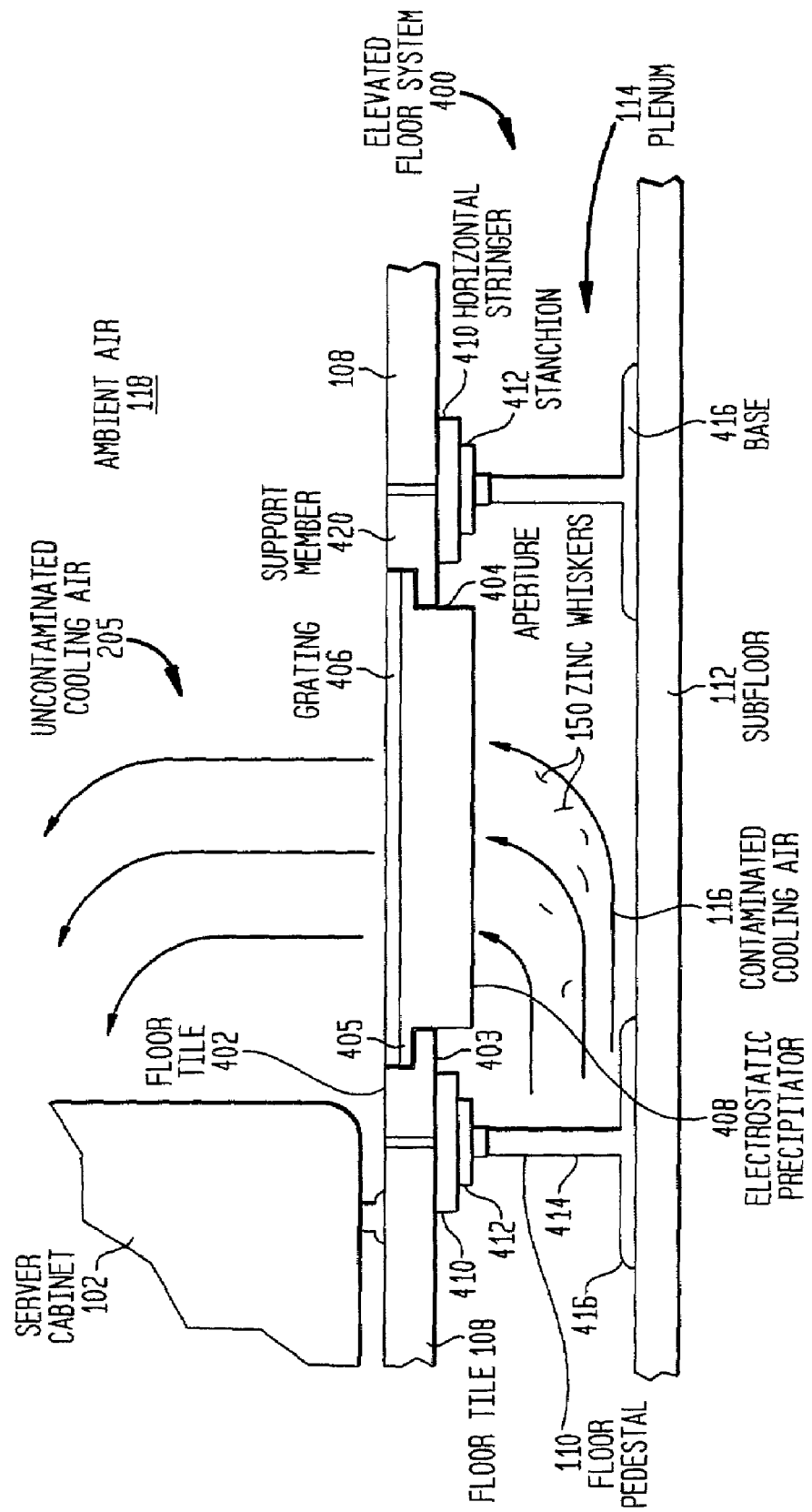

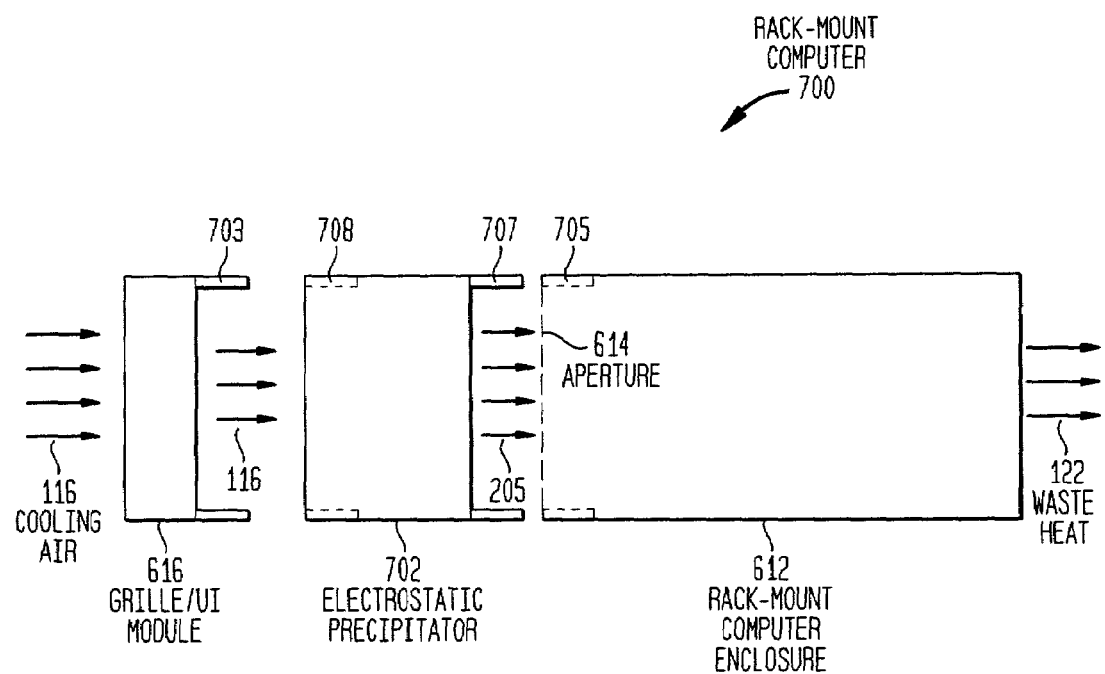

ELECTROSTATIC PRECIPITATOR

BACKGROUND OF THE INVENTION

1. Field of the Invention

The present invention relates generally to electronics systems and, more particularly, to an electrostatic precipitator for removing zinc whiskers from cooling air for electronics systems.

2. Related Art

Computers such as servers and the like are housed within an electronics enclosure or chassis that provides multiple functions such as protecting operating components from damage and shielding against undesirable electromagnetic emissions. With the advent of data centers and the recent trend toward collocation facilities, such electronics enclosures are often configured to be mounted in a standard-size cabinet commonly referred to as a rack enclosure or cabinet. Such a cabinet can house multiple rack-mount collocation computers.

Thermal management within data centers is becoming increasingly difficult due to the continued increase in processing power of servers and other rack-mount collocation computers. Waste heat generated within such computers must be dissipated to avoid damage. Excessive heat, for example, can cause premature failures in processors, power supplies, disk drives and expensive plug-in cards such as fax modems, T1 trunk cards, RAID (redundant array of inexpensive disks) controllers and video-streaming cards, as well as other components.

Conventional data center installations use elevated or raised floors constructed from removable tiles. Elevated floors provide unrestricted space for the flexible routing of cables and power lines under the floor. One particular function of elevated floor systems is that they form a sub-floor duct or plenum for distributing cooling air. Typically, cooling air is forced through the plenum and enters the ambient air in the data center through gratings formed in certain floor tiles.

Traditionally, waste heat generated in rack-mount collocation computers was removed through the vertical distribution of cooling air from the plenum floor system. Conventional cabinets typically included fans mounted at or near the top of the cabinet. The fans draw cooling air up into the cabinet through an opening in the cabinet base. The cooling air is then exhausted from the cabinet into the ambient air in the data center.

More recently, manufacturers have developed servers with faster processing chips and greater input power in a smaller rack-mount enclosure. Because such servers require cooling air to be drawn through rather than around the rack-mount enclosure, cooling fans are now commonly integrated into servers. To provide on-board cooling fans with adequate airflow, rack cabinets have been redesigned to allow air to readily flow through the cabinet doors.

Data center floor tiles commonly include a steel, wood or wood-composite core with a steel bottom plate either hot-dipped or electroplated with zinc to prevent rust and corrosion. The electroplated zinc-coated tiles exhibit a peculiar behavior of having zinc filaments grow from various locations on the bottom surface. These zinc filaments are commonly referred to as zinc whiskers. Under stress or changing environmental conditions, the zinc atom structure separates from the steel and forms microscopic columns in a process known as atom migration. These columns of zinc, which grow from the bottom and sides of the elevated floor tiles, are approximately 2 microns in diameter, and grow at a rate of approximately 250 microns per year.

Zinc whisker contamination most commonly occurs when floor tiles of older elevated floor systems are disturbed. For example, when tiles are removed to gain access to the area under the floor to run cables or power lines, tiles are often placed one or top of another or are slid around on the floor. Such actions strip off thousands of zinc whiskers from the underside of the tile and introduce them into the air circulating in the data center. Zinc whisker contamination also often occurs simply with the passage of time. Zinc whiskers continually grow from the bottom of the floor tile into the stream of cooling air traveling through the raised floor plenum. Eventually, the zinc whiskers are severed from the floor tile by the passing cooling air. On-board cooling fans in rack-mount computers draw the zinc whiskers into the internal logic cages and power supplies. Once inside, the velocity of the zinc whiskers progressively diminishes due to the maze of components and electrical wires, facilitating the release of the zinc whiskers into the cooling air. The zinc whiskers, which are conductive contaminants, then settle on electronic components of logic cards and power supplies causing voltage or signal perturbations. Zinc whiskers can also cause catastrophic failures by shorting a power supply. Oftentimes malfunctions and data errors caused by zinc whiskers are transient and not repeatable because the zinc whiskers fuse and vaporize, or are repositioned when the rack-mount computer is removed for fault analysis.

The most common recommendation in the electronics industry to address the problems associated with zinc whiskers is to replace all accessible floor tiles and encapsulate those that are inaccessible. This is an extremely labor-intensive procedure involving specialized decontamination and encapsulation of air plenum surfaces. Another drawback of this and other disruptive procedures is that they increase the amount of zinc whisker released into the cooling air and ultimately distributed throughout the data center. A further drawback is that such a procedure often requires the computer systems supported by the elevated floor system to be taken off-line.

Other conventional approaches to addressing problems stemming from zinc whiskers have met with little success. For example, common filters are ineffective because zinc whiskers are small relative to dust and other common particulates. On the other hand, attempts to use filters capable of capturing zinc whiskers dramatically reduces airflow and cooling capacity in the data center. Other conventional approaches include coating printed circuit boards with a conformal coating, which is expensive, and separating high-voltage nodes of the printed circuit boards, which addresses only a subset of the problems caused by zinc whiskers, and which requires a redesign effort that could result in a printed circuit board which is too large for the server chassis.

SUMMARY OF THE INVENTION

While the problems associated with zinc whiskers have been known in the electronics industry for some time, older electronic designs were less susceptible. As technology advanced, circuitry became much denser and operating voltages decreased thereby increasing the ability of zinc whiskers to adversely impact hardware reliability. What is needed, therefore, is an approach for preventing the adverse effects of zinc whiskers. Such an approach should be cost effective and its implementation should not reduce system availability.

In one aspect of the invention, an electrostatic precipitator is disclosed. The electrostatic precipitator removes zinc whiskers from cooling air provided to cool components in an electronics enclosure. The electrostatic precipitator comprises an ionizer configured to apply a charge to zinc whiskers suspended in the cooling air. The electrostatic precipitator also comprises a collector that collects charged zinc whiskers from the contaminated cooling air to generate uncontaminated cooling air for cooling the components of the electronics enclosure. The electrostatic precipitator is configured to be disposed in the cooling air flow path upstream of the components such that the cooling air travels through the electrostatic precipitator prior to impinging on the components.

In another aspect of the invention, a method for removing zinc whiskers from contaminated cooling air to provide uncontaminated cooling air for cooling components of an electronics enclosure having an air-intake aperture is disclosed. The method comprises passing the contaminated cooling air through an ionizer to charge the zinc whiskers; collecting the charged zinc whiskers on one or more of a plurality of charged collection plates in the electrostatic precipitator; and exhausting from the collecting means uncontaminated cooling air free of zinc whiskers.

In a further aspect of the invention, an electronics system is disclosed. The electronics system comprises an enclosing means for housing electronic components, the enclosing means having an aperture through which cooling air travels into the electronics enclosure. The electronics system also includes an ionizing means for applying a charge to zinc whiskers suspended in the contaminated cooling air, and a collecting means for collecting the charged zinc whiskers from the contaminated cooling air prior thereby generating uncontaminated cooling air.

BRIEF DESCRIPTION OF THE DRAWINGS

Further features and advantages of the present invention as well as the structure and operation of various embodiments of the present invention are described in detail below with reference to the accompanying drawings. In the drawings, like reference numerals indicate identical or functionally similar elements. This description is given by way of example only and in no way restricts the scope of the invention. A brief description of the figures follows.

FIG. 2 is a schematic block diagram of one embodiment of an electrostatic precipitator of the present invention.

FIG. 3 is an alternative embodiment of an electrostatic precipitator of the present invention.

FIG. 4 is a side view of an elevated floor system including a floor tile having an integrated electrostatic precipitator in accordance with one embodiment of the present invention.

FIG. 7 is a schematic block diagram of the rack-mount collocation computer illustrated in FIG. 6 configured with an electrostatic precipitator in accordance with an alternative embodiment of the present invention.

DETAILED DESCRIPTION

Figure 1A:
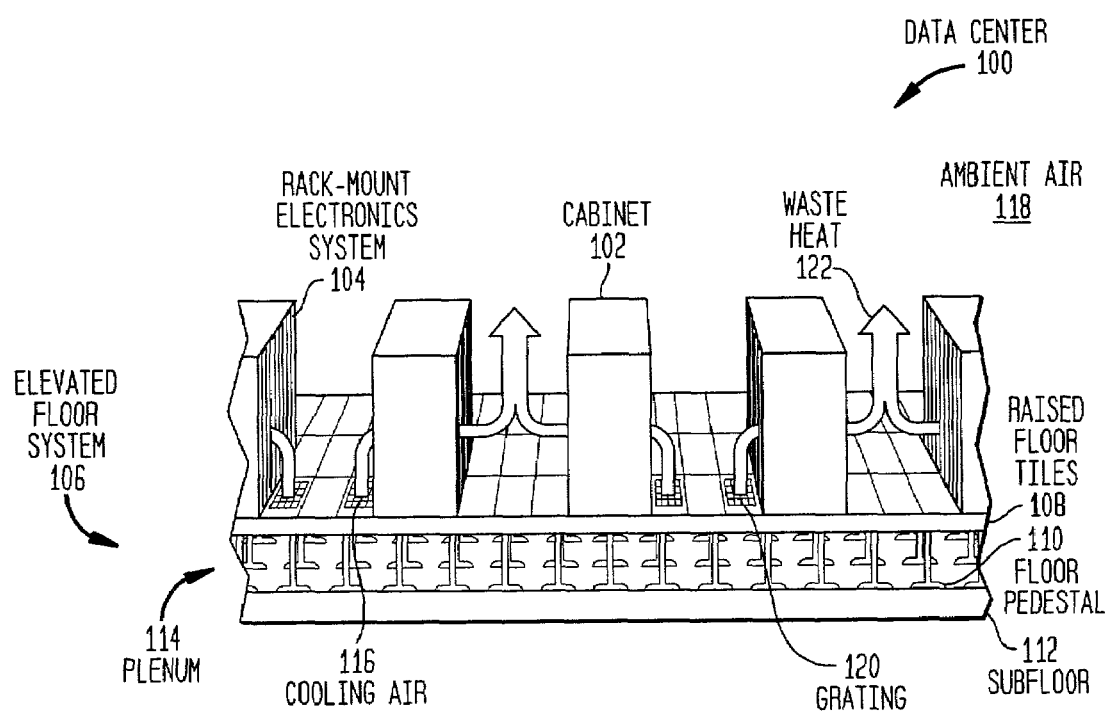
FIG. 1A is a perspective view of a conventional data center in which rows of rack cabinets containing rack-mount collocation computers supported by an elevated floor system.

The present invention is directed to an electrostatic precipitator for removing zinc whiskers from cooling air prior to the cooling air impinging on components in an electronics system enclosure. Because zinc whiskers are particularly problematic in computer rooms, collocation facilities and other data centers (collectively, "data centers") having an elevated floor system, the present invention will be described with reference to a data center 100, a perspective view of which is depicted in FIG. 1A. Data center 100 includes aisles of cabinets 102 such as the standard server racks commonly used in data centers. Such standard rack cabinets 102 are configured to operationally secure electronics equipment housed in a rack-mount enclosure. In data center 100, the electronics systems are generally computers and, in particular, servers. These and other rack-mount systems are generally and collectively referred to herein as rack-mount electronics systems 104.

Cabinets 102 are typically arranged in aisles on an elevated floor system 106. Elevated floor system 106 comprises an array of floor tiles 108 supported on floor pedestals 110 resting on a sub-floor 112. Elevated floor systems 106 are, as noted, commonly implemented in data centers to facilitate the placement of data cables, power lines and the like. Maintenance, replacement and reconfiguration of rack-mount electronics systems 104 require frequent access to the area below raised floor tiles 108.

As noted, elevated floor system 106 creates a plenum 114 through which cooling air 116 travels. Cooling air 116 is generated by an air conditioning unit (not shown) located elsewhere in or adjacent to data center 100. Cooling air 116 travels through plenum 114 and enters ambient air 118 in data center 100 through gratings 120 formed in certain floor tiles 108.

On-board fans (not shown) in rack-mount electronics systems 104 draw cooling air 116 into the electronics enclosure to cool the active components contained therein. Waste heat 122 is exhausted from rack-mount electronics systems 104 and cabinets 102 into ambient air 118 in data center 100. Ambient air 118 is then recirculated through the cooling system, and the above process is repeated.

In the exemplary data center 100 illustrated in FIG. 1A, cabinets 102 are, as noted, arranged in aisles. Rack-mount electronics systems 104 are arranged in adjacent cabinets 102 such that all on-board fans are oriented in the same direction, forming alternating aisles in which cool air is drawn into, and waste heat is exhausted from, rack-mount systems 104. That is, rack-mount systems 104 mounted in each row of cabinets 102 are arranged such that their on-board fans draw air into the electronics enclosure from the same aisle and exhaust waste heat 122 into the same neighboring aisle. It should be appreciated that this is merely an exemplary arrangement and that the present invention can be implemented in any electronics environment.

Figure 1B:
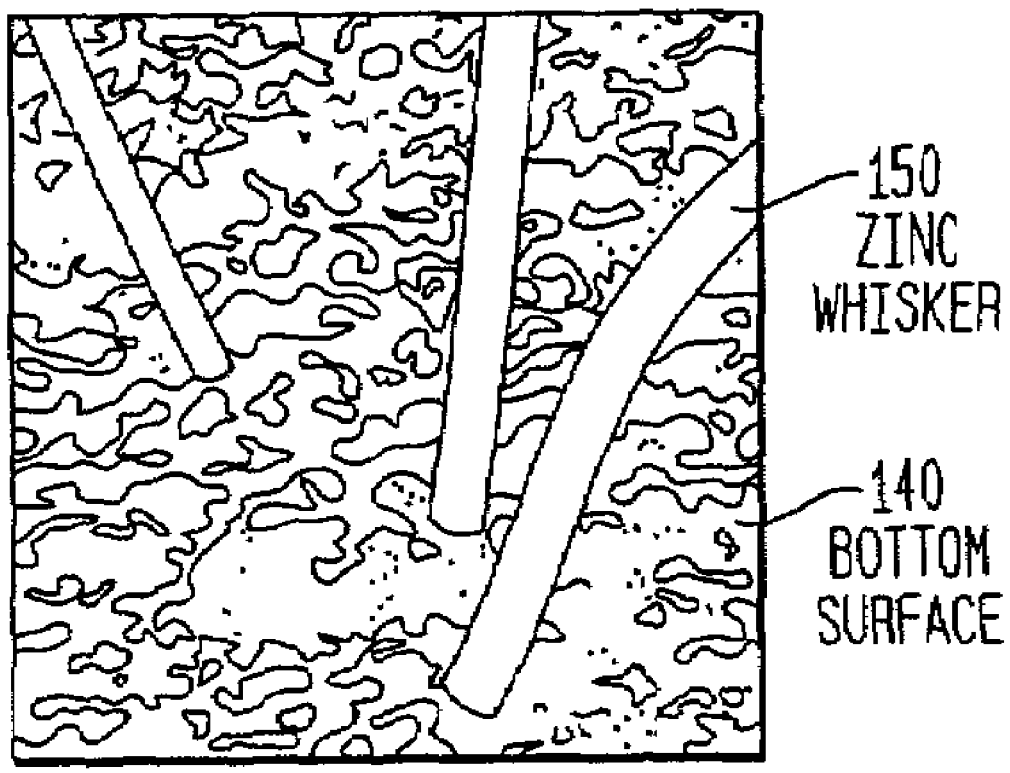
FIG. 1B is a magnified view of a bottom surface of an electroplated raised floor tile showing the development of zinc whiskers.

FIG. 1B is a magnified view of a bottom surface 140 of a raised floor tile 108 electroplated with zinc. Zinc filaments referred to herein as zinc whiskers 150 grow from various locations on bottom surface 140 of raised floor tiles 108. Because zinc is a conductive material, a zinc whisker 150 can be considered a low capacitance resistance of 10 W to 40 W, depending on whisker geometry, with a DC fusing current of approximately 10 mA. Thus, although zinc whiskers 150 are small in size, they are large enough to cause problems such as short circuits, voltage variances, and other signal disturbances in rack-mount electronics systems 104 when they are released into the circulating air in data center 100.

The present invention is directed to the use of an electrostatic precipitator configured to remove zinc whiskers 150 from cooling air 116 prior to the cooling air 116 impinging on components contained in an electronics enclosure such as rack-mount electronics systems 104. Because cooling air 116 travels through air plenum 114 and is subject to zinc whisker contamination, cooling air 116 containing zinc whiskers 150 is referred to herein as contaminated cooling air 116. As one or ordinary skill in the art will find apparent, the electrostatic precipitator can be positioned at any location upstream of the components contained in an electronics enclosure, such as within electronics enclosure itself.

Advantageously, the electrostatic precipitator of the present invention prevents zinc whiskers 150 from coming into contact with components in an electronics enclosure thereby preventing equipment failure and reducing hardware down-time. Significantly, embodiments of the electrostatic precipitator of the present invention can be selectively installed as an add-on component to existing equipment. Such retrofitting of specific systems reduces the cost of implementation. Thus, the present invention provides a solution to problems associated with zinc whiskers in computers without incurring costly treatment or replacement of elevated floor systems. The structure and operation of certain embodiments of the electrostatic precipitator of the present invention are described below, followed by a description of different configurations of the electrostatic precipitator.

FIG. 2 is a schematic block diagram of one embodiment of an electrostatic precipitator 200. Electrostatic precipitator 200 is a two-stage electrostatic precipitator comprising a first stage in which contaminated cooling air 116 is passed through an ionizer 202. In this illustrative example, ionizer 202 imparts a negative charge to zinc whiskers 150 contained within contaminated cooling air 116. Airflow 203 exiting ionizer 202 has charged particles dispersed therein. Charged airflow 203 is passed through a collector 206 which removes the charged zinc whiskers 204 from the cooling air, effectively decontaminating cooling air 116. The air exiting collector 206 has less zinc whiskers 150 than contaminated cooling air 116 and, preferably, is free of zinc whiskers 150. Cooling air flowing from electrostatic precipitator 200 is referred to herein as uncontaminated cooling air 205.

In the exemplary embodiment illustrated in FIG. 2, ionizer 202 includes an array of electrode wires referred to as discharge electrodes 210. Discharge electrodes 210 are substantially parallel with each other and are positioned orthogonal to the direction of airflow through electrostatic precipitator 200. The array of discharge electrodes 210, referred to as electrode grid 208, is connected to a high voltage source at several kilovolts of negative polarity. In one embodiment, electrode grid 208 is connected to a DC-to-DC converter 210 that converts commonly-available 12 volt power to, for example, 13.5 kV DC. Maintaining discharge electrodes 210 at several thousand volts causes them to produce an ionizing field or corona 212 that releases electrons into the air stream of contaminated cooling air 116. Preferably, discharge electrodes 210 are arranged with minimal spacing to prevent zinc whiskers 150 from passing through electrostatic precipitator 200 without passing through at least one corona 212. The trajectory of zinc whiskers 150 pass through the corona 212 of one or more discharge electrodes 210, as illustrated by the dashed line trajectory of zinc whisker 150 in FIG. 2. One or more electrons located in the coronas 212 attach to zinc whiskers 150. This imparts a net negative charge, as represented by the negative charge indication on zinc whisker 204 in airflow 203.

Collector 206 comprises a collector array 218 connected to a DC-to-DC converter 222. Collector array 218 is a series of spaced rectangular electrodes referred to as collection plates 214. Collection plates 214 are substantially parallel with each other and the direction of airflow through electrostatic precipitator 200. Collection plates 204 are, therefore, substantially orthogonal to discharge electrodes 210. Contaminated cooling air 116 entering collector array 218 travels past and between adjacent collector plates 214. Collection plates 214 are connected to a high voltage source at several kilovolts of positive polarity, attracting negatively-charged zinc whiskers 204. In one embodiment, collector plates 214 are each connected to DC-to-DC converter 222 that converts 12 volts to, for example, 6.5 kV, although other voltages can be used. This causes negatively-charged zinc whiskers 204 to migrate to a collection plate 214. This is illustrated in FIG. 2 by the dashed-line trajectory of charged zinc whisker 204 traveling into collector 206 and eventually landing on a collection plate 214. Uncontaminated cooling air 205 then flows from electrostatic precipitator 200.

FIG. 3 is a side view of an alternative embodiment of an electrostatic precipitator of the present invention. Electrostatic precipitator 300 is a single stage device in which discharge electrodes 210 are located between collection plates 214. As contaminated cooling air 116 enters electrostatic precipitator 300, it immediately travels between a pair of collection plates 214. The position of discharge electrodes 210 and collection plates 214 relative to the direction of air flow is the same as that described above with respect to electrostatic precipitator 200. However, because in this embodiment, discharge electrodes 210 are aligned in the direction of air flow, zinc whiskers 150 can travel through a corona 212 of a number of discharge electrodes 210. Eventually such zinc whiskers 150 accumulate a sufficient negative charge to become a charged zinc whisker 204. Charged zinc whiskers 204 are then drawn toward a collection plate 214 as illustrated by the dashed line trajectories in FIG. 3. This embodiment allows different absolute or relative voltage levels to be used. Uncontaminated cooling air 205 is then exhausted from electrostatic precipitator 300.

It should be understood that other embodiments of electrostatic precipitators can also be implemented. For example, in an alternative two-stage electrostatic precipitator, adjacent collection plates 214 have opposing polarities; that is, one collection plate 214 is maintained at a positive voltage while a neighboring collection plate 214 is maintained at a negative voltage. This operating configuration encourages rapid collection of zinc whiskers 150 due to the simultaneous attractive and repulsive forces acting on a charged zinc whisker 150 by neighboring collection plates 214. In one version of this embodiment, all discharge electrodes 210 are maintained at either a positive or a negative voltage. In another version of this embodiment, neighboring discharge electrodes 210 are maintained at opposing polarities. In a further embodiment, collection plates 214 are grounded.

It should be apparent to those of ordinary skill in the art that the operating configuration of the electrostatic precipitators of the present invention are to be selected to achieve a desired operating efficiency in a given data center environment. Such configuration parameters include, for example, the relative physical arrangement of the discharge electrodes and collection plates, the distance between neighboring discharge electrodes and collection plates, the voltages at which the discharge electrodes and collection plates are maintained, etc. These and other physical and operating parameters are determined based on a number of factors. Such factors include, but are not limited to, the quantity, speed and size of zinc whiskers 150, the volume of contaminated cooling air 116 passing through the electrostatic precipitator, the cooling requirements of the electronics systems relying on uncontaminated cooling air provided by the electrostatic precipitator, the size of the electrostatic precipitator relative to the volume and flow rate of contaminated cooling air 116, etc. The selection of the configuration and operating parameters of the electrostatic precipitator is considered to be within the purview of those of ordinary skill in the art.

In accordance with the present invention, electrostatic precipitators 200, 300 are configured to remove zinc whiskers 150 from contaminated cooling air 116. Because zinc whisker contamination in cooling air 116 is a well-known problem in today's data centers, the electrostatic precipitator of the present invention is described as a separate unit that can be retrofitted into an existing data center 100, cabinet 102 or rack-mount electronics system 104. Accordingly, the embodiments of the electrostatic precipitator described below are configured to be inserted into the air stream of contaminated cooling air 116 entering data center 100 (FIG. 4), cabinets 102 (FIG. 5) and rack-mount electronics systems 104 (FIG. 6). From the following descriptions of these embodiments, it should become apparent that the electrostatic precipitator of the present invention can be configured to be disposed in any portion of the path of contaminated cooling air 116 to capture zinc whiskers 150. For example, the electrostatic precipitator can be integrated within an electronics enclosure or mounted at the outlet of an air conditioning unit.

FIG. 4 is a side view of an elevated floor system 400 including a floor tile 402 having an integrated electrostatic precipitator 408 to remove zinc whiskers 150 from contaminated cooling air 116. Electrostatic precipitator 408 releases uncontaminated cooling air 205 into ambient air 118 of data center 100. In the embodiment illustrated in FIG. 4, a pedestal type elevated floor system is illustrated. Floor pedestals 110 are fixed-height pedestals with a base 416 that rests on sub-floor 112 and a vertical member 414 that supports a stanchion 412. Horizontal stringers 410 rest on and are secured to stanchions 412 to create rows of raised, substantially parallel, horizontal support members. Removable, uniform size floor tiles 108 rest on horizontal stringers 410 to form a plenum 114 through which contaminated cooling air 116 travels. Cooling air is generated by a cooling unit (not shown) and forced through plenum 114. At the point at which the cooling air enters data center 100, it contains zinc whiskers 150 and is, as noted, referred to as contaminated cooling air 116.

In place of selected floor tiles 108, elevated floor system 400 includes floor tiles 402 located at appropriate locations to provide uncontaminated cooling air 205 to active components in data center 100. In the example embodiment shown in FIG. 4, a single floor tile 402 is shown located adjacent to a cabinet 102 which operationally supports rack-mount electronics systems 104 such as servers. Floor tiles 402 comprise a support member 420 having an aperture 404 formed therein to receive an electrostatic precipitator 408. Electrostatic precipitator 408 can be any of the electrostatic precipitators noted above as well as any other electrostatic precipitator configured to ionize and collect zinc whiskers 150 traveling through contaminated cooling air 116. Electrostatic precipitator 408 is constructed and arranged to be removably secured to support member 420 such that contaminated cooling air 215 travels through electrostatic precipitator 408. In the embodiment illustrated in FIG. 4, aperture 404 in support member 420 has a countersink 403 formed therein. Electrostatic precipitator 408 has a flange 405 adapted to mate with countersink 403 when electrostatic precipitator 408 is operationally positioned in aperture 404. It should be understood, however, that electrostatic precipitator 408 can be secured to support member 420 of floor tile 402 in any known manner. In alternative embodiments, electrostatic precipitator 408 and floor tile 402 can be unitary. In this exemplary implementation, floor tile 402 also includes an optional grating 406 to transfer weight applied to floor tile 402 to support member 420.

In operation, contaminated cooling air 116 with zinc whiskers 150 travels through plenum 114 into electrostatic precipitator 408. Electrostatic precipitator 408 ionizes and collects zinc whiskers 150 as described above, allowing uncontaminated cooling air 205 to enter ambient air 118 in data center 100. Uncontaminated cooling air 205 is then drawn into server cabinet 102 by on-board fans (not shown) in rack-mount electronics systems 104 (also not shown in FIG. 4).

Typical raised floor tiles are 2 feet by 2 feet squares while a typical pedestal-type floor is between six and twelve inches above sub-floor 112. Electrostatic precipitator 408, therefore, can be have a wide range of dimensions to accommodate a desired configuration. Also, electrostatic precipitator 408 is easily accessible for repair, cleaning and maintenance. In addition, any number of floor tiles 402 can be installed in elevated floor system 400 to provide a desired cooling capacity in data center 100 while insuring that only uncontaminated cooling air 205 is provided to data center 100. It should also be appreciated that elevated floor system 400 illustrated in FIG. 4 is exemplary only and that the electrostatic precipitator of the present invention can be implemented in other elevated floor systems and floor tiles to remove zinc whiskers 150 from contaminated cooling air 116. For example, floor tile 402 can be implemented in movable-type, clip-on, bolt-down and other elevated floor systems.

Figure 5:
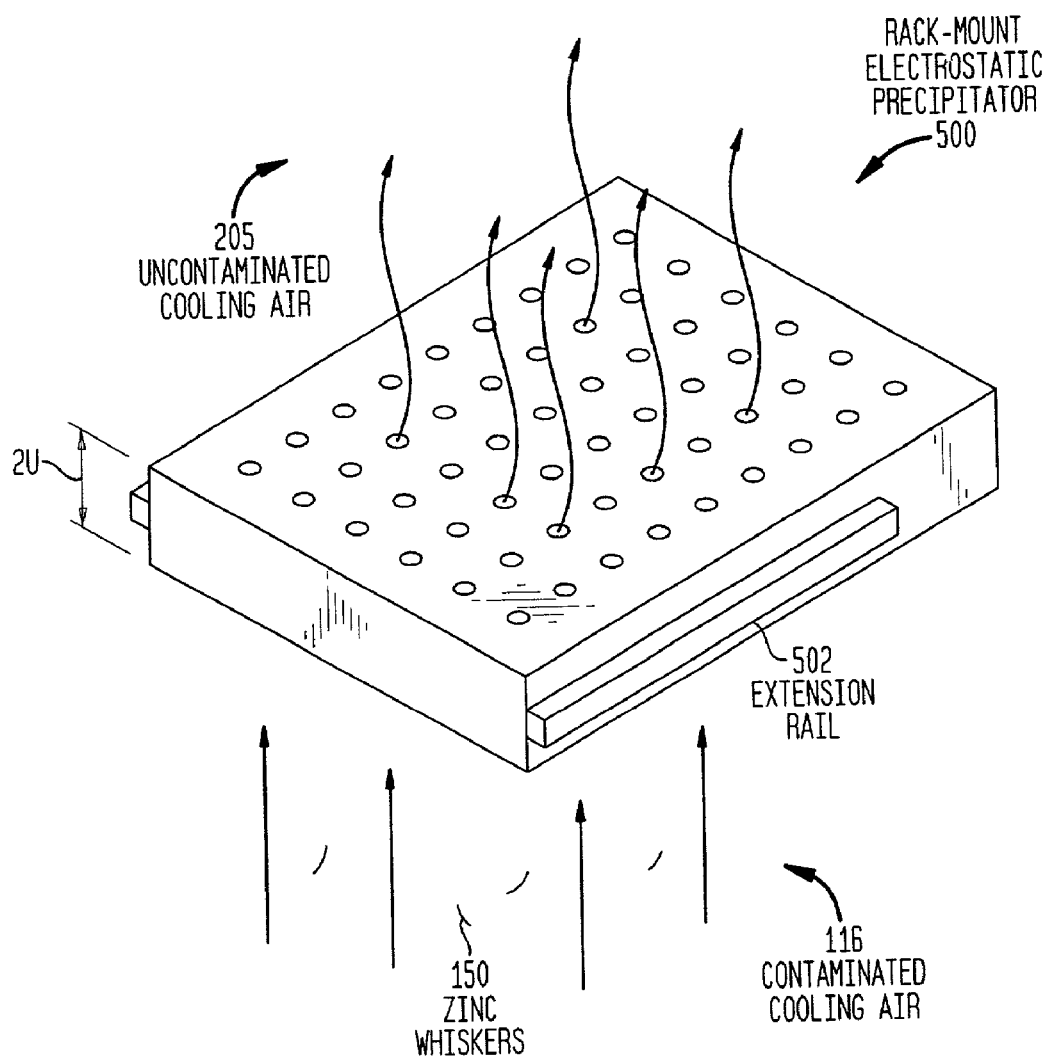
FIG. 5 is a perspective view of a rack-mount electrostatic precipitator in accordance with an alternative embodiment of the present invention.
Figure 6:
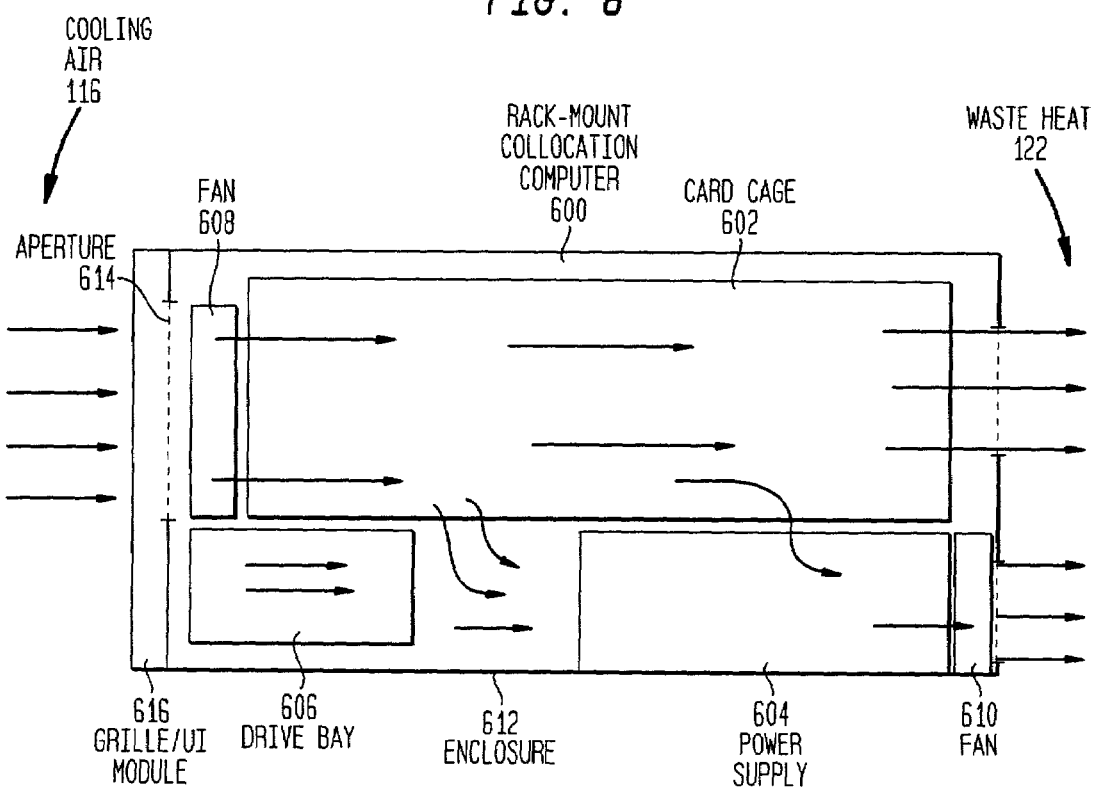
FIG. 6 is a schematic block diagram of a conventional rack-mount collocation computer.

FIG. 5 is a perspective view of an alternative embodiment of the electrostatic precipitator of the present invention. As noted, waste heat 122 generated in rack-mount electronics systems 104 has traditionally been removed through the vertical distribution of cooling air 116 from elevated plenum floor system 106. Contaminated cooling air 116 is drawn up and through cabinet 102 through an opening in the base of the cabinet by fans mounted at or near the top of the cabinet. The air is exhausted from the cabinet into the data center ambient air 118.

In such cabinets 102, removal of zinc whiskers 150 from cooling air 116 can be achieved with rack-mount electrostatic precipitator 500. Electrostatic precipitator 500 is constructed and arranged to be removably mounted in a bottommost position in a cabinet 102 to receive contaminated cooling air 116 as it enters through the base of cabinet 102. As with electrostatic precipitator 408, electrostatic precipitator 500 can be any of the above noted and other electrostatic precipitators configured to ionize and collect zinc whiskers 150. The dimensions of electrostatic precipitator 500 are such that precipitator 500 can be mounted in cabinet 102. Accordingly, electrostatic precipitator 500 is preferably designed to fit within the standard width but can have any desired vertical height suitable for the application.

It should be appreciated that electrostatic precipitator 500 includes other common features to facilitate mounting in cabinet 102. For example, extension rails 502 are secured to opposing sides of electrostatic precipitator 500 to mate with corresponding railings in cabinet 102. It should be appreciated by those of ordinary skill in the art that other mounting-related features commonly implemented in rack-mount devices can also be included with electrostatic precipitator 500.

An alternative embodiment of the electrostatic precipitator of the present invention is described below with reference to a rack-mount collocation computer. As noted, more recently, manufacturers have developed servers with greater processing power housed in smaller rack-mount enclosures. A schematic block diagram of an exemplary conventional rack-mount collocation computer 600 is illustrated in FIG. 6. Rack-mount collocation computer 600 includes an enclosure 612 having dimensions suitable for mounting in a standard size cabinet 102. Typically, a card cage 602, power supply 604, and drive bay 606 are housed in enclosure 612. The illustrated configuration of such components in enclosure 612 is but just one example. Because rack-mount collocation computer 600 requires cooling air to be drawn through rather than around enclosure 612, cooling fans 608 and 610 have been installed in rack-mount enclosure 612. Fan 608 draws cooling air into enclosure 612 through a grille, perforations, or other type of aperture 614 (generally, aperture 614) in collocation computer 600. In addition, fan 610 exhausts waste heat 122 through vents in the rear of collocation computer 600. The relative position of fans 608, 610, along with the internal configuration of the components of rack-mount collocation computer 600 determine the path cooling air 116 takes from fan 608 to fan 610. In FIG. 6, the path of cooling air through collocation computer 600 is illustrated by a plurality of arrows.

Commonly, rack-mount collocation computer 600 includes a front grille mounted on the front of enclosure 612 through which cooling air 116 travels when entering enclosure 612. Other rack-mount collocation computers have a module attached to the front thereof that includes a user interface. Such a user interface may be, for example, indicators, displays, manual control knobs and push buttons, and the like. Oftentimes, such user interface elements and grille are integrated into a single module 616 that is mechanically secured to electronics enclosure 612. One or more cables or leads for transferring data and power between module 616 and the components housed in electronics enclosure 612 is not shown in FIG. 6.

An exploded schematic view of rack-mount collocation computer 600 with an electrostatic precipitator mounted thereon to remove zinc whiskers 150 from contaminated cooling air 116 to provide rack-mount collocation computer 600 with uncontaminated cooling air 205 is provided in FIG. 7. In this alternative embodiment, electrostatic precipitator 702 is configured to be positioned in the air circulation path adjacent to air intake aperture(s) 614 of electronics enclosure 612. In the exemplary application shown in FIG. 6, electrostatic precipitator 702 is secured to the exterior of rack-mount collocation computer 600 immediately adjacent to air intake aperture 614 in the flow path of contaminated cooling air 116 so that electrostatic precipitator 702 can remove zinc whiskers 150 from all incoming contaminated cooling air 116 prior to cooling air 116 entering electronics enclosure 612.

In the embodiment illustrated in FIG. 7, grille/user interface module 616 has extension arms 703 that mate with slots 705 formed in enclosure 612. Electrostatic precipitator 702 is mounted on enclosure 612 such that contaminated cooling air 116 travels through electrostatic precipitator 704 prior to entering enclosure 612. In this embodiment, electrostatic precipitator 702 includes extension arms 707 for mounting electrostatic precipitator 702 on enclosure 612 using slots 705. Electrostatic precipitator 702 is configured with slots 708 similar to slots 705. This enables module 616 to be mounted on electrostatic precipitator 702 using flanges 703. Communication and power lines (not shown) would be extended through electrostatic precipitator 702 to connect module 704 with enclosure 612.

It should be appreciated that electrostatic precipitator 702 can be mounted to rack-mount computer enclosure 612 using any technique now or later developed. In addition, in alternative embodiments in which the user interface is integrated into rack-mount collocation computer 612, electrostatic precipitator 702 is secured to the surface of enclosure 612 immediately adjacent to air intake aperture 614 in the flow path of cooling air 116. In one such embodiment, the electrostatic precipitator is configured with appropriately configured apertures to view indicators on the integrated user interface that would otherwise be covered by electrostatic precipitator 702.

While various embodiments of the present invention have been described above, it should be understood that they have been presented by way of example only, and not limitation. One example is the source of the zinc whiskers. It should be appreciated that zinc whiskers may grow on other surfaces electroplated with zinc. For example, at one time or another in the past few decades sub-racks, switch assemblies and card cages have been electroplated with zinc. Zinc whiskers originating on such elements will also be ionized and captured by the electrostatic precipitator of the present invention. Another example is the environment or application presented above. The present invention was described in the context of a data center having an elevated floor. This is because such environments can be greatly impacted by zinc whiskers due to the vast surface area of electroplated zinc surfaces, the turbulent air flow typically found in the air plenum beneath the elevated floor of such facilities, and the quantity of computers, servers and other rack-mount collocation computers that can be adversely impacted by zinc whiskers. However, it should be appreciated that the electrostatic precipitator of the present invention can be implemented in other environments in which zinc whisker contamination is present. As noted, the electrostatic precipitator of the present invention is described as a device which can be used to retrofit an existing elevated floor tile 108, cabinet 102 or electronics system 104. It should also be appreciated that the electrostatic precipitator can be constructed and arranged to be installed within an electronics enclosure during the manufacturing of, for example, rack-mount electronics systems 104. In such embodiments, the electrostatic precipitator can be configured to be incorporated into electronics enclosure 612 immediately adjacent to aperture 614 or, perhaps, immediately adjacent to a fan 608 that is in contact with aperture 614. Alternatively, the electrostatic precipitator can be an integral part of a larger ventilation assembly that also comprise a fan, an optional filter, grille, and other related components which can be installed or manufactured in collocation computer 600. Alternatively, the electrostatic precipitator of the present invention can be configured to be an integral part of a larger cooling system. Another example is the particular type of electrostatic precipitator. It should be understood that other types of electrostatic precipitators now or later developed can also be implemented to collect zinc whiskers 150 from contaminated cooling air 116. For example, in alternative embodiments, point-to-plane and concentric electrostatic precipitators can be implemented. Still further, the electrostatic precipitator of the present invention can be constructed and arranged to be placed in other locations in the air flow path of contaminated cooling air 116 between the location of zinc whiskers 150 and the components housed in electronics enclosure 612. For example, in alternative embodiments, the electrostatic precipitator is configured to be secured in air ducts which supply cooling air to an electronics system. Thus, the breadth and scope of the present invention should not be limited by any of the above-described exemplary embodiments, but should be defined only in accordance with the following claims and their equivalents.

What is claimed is:

1. An electrostatic precipitator for removing particles from cooling air provided to pass through an electronics system enclosure comprising:
    an ionizer configured to apply a charge to the particles in contaminated cooling air received by the electrostatic precipitator;
    a collector configured to collect the charged particles from the contaminated cooling air to provide substantially uncontaminated cooling air; and
    a housing constructed and arranged to house said ionizer and said collector and to be attached to an exterior surface of the enclosure adjacent to a first aperture of the enclosure such that the contaminated cooling air flows into said electrostatic precipitator and the substantially uncontaminated cooling air flows from said electrostatic precipitator into the enclosure through the first aperture.

2. The electrostatic precipitator of claim 1, wherein the particles comprise zinc whiskers.

3. The electrostatic precipitator of claim 1, wherein the electronics system comprises a computer system having at least one fan operable to draw air into the enclosure through the first aperture.

4. The electrostatic precipitator of claim 3, wherein the computer system comprises a network server.

5. The electrostatic precipitator of claim 1, wherein the computer system is a rack-mount collocation computer.

6. The electrostatic precipitator of claim 1, wherein said electronics system further comprises a user interface module adapted to be attached to said enclosure adjacent to the first aperture, the user interface module having a second aperture through which the contaminated cooling air passes prior to entering the enclosure through the first aperture, and wherein said electrostatic precipitator is configured to be secured between the enclosure and the user interface module such that contaminated cooling air flowing into said electrostatic precipitator is received via said second aperture.

7. The electrostatic precipitator of claim 1, wherein said enclosure of said electronics system further comprises a user interface adjacent to the first aperture, and wherein said electrostatic precipitator is configured to attach to an exterior surface of the enclosure so as to cover the user interface and first aperture, and wherein said electrostatic precipitator further comprises a viewing aperture through which at least a portion of said user interface is visible when said electrostatic precipitator is attached to the enclosure.

8. An electrostatic precipitator for providing substantially uncontaminated cooling air to ambient air in a data center, comprising:
    an ionizer configured to apply a charge to the particles in contaminated cooling air received by the electrostatic precipitator;
    a collector configured to collect charged particles from the contaminated cooling air to generate substantially uncontaminated cooling air; and
    a housing constructed and arranged to house said ionizer and said collector and to be integrated into a floor tile of an elevated floor system of the data center such that the electrostatic precipitator captures airborne particles contained in contaminated cooling air flowing through a plenum below the elevated floor system, and releases the substantially uncontaminated cooling air into the ambient air in the data center.

9. The electrostatic precipitator of claim 8, wherein the floor tile comprises a support panel having a top side, a bottom side and an aperture extending through the support panel from the top side to the bottom side; and
    wherein said housing of said electrostatic precipitator is configured to be attached to the support panel and operationally disposed in said support panel aperture.

10. The electrostatic precipitator of claim 9,
    wherein said support member has at least one countersink formed around at least a portion of a perimeter of said aperture; and
    wherein said housing of said electrostatic precipitator has at least one flange extending from an exterior surface of said housing to engage said at least one countersink when said electrostatic precipitator is located in said aperture.

11. The electrostatic precipitator of claim 8, wherein said elevated floor system is one of a raised pedestal elevated floor system, movable-type elevated floor system, and clip-on, bolt-down elevated floor system.

12. The electrostatic precipitator of claim 8, wherein the particles comprise zinc whiskers.

13. An electrostatic precipitator for removing particles from cooling air provided to at least one rack-mount electronics system mounted in a cabinet, the cabinet having a first aperture through which cooling air enters the cabinet and a second aperture through which waste heat is exhausted from the cabinet, comprising:
    an ionizer configured to apply a charge to particles in contaminated cooling air received by the electrostatic precipitator;
    a collector configured to collect charged particles from the contaminated cooling air to generate substantially uncontaminated cooling air; and
    a housing constructed and arranged to house said ionizer and said collector, said housing having dimensions substantially the same as one of said at least one rack-mount electronic systems thereby enabling said electrostatic precipitator to be mounted in the cabinet between the air-intake aperture of the cabinet and the at least one rack-mount electronic systems mounted in the cabinet.

14. The electrostatic precipitator of claim 13, further comprising:
    extension rails secured to opposing sides of said housing of said electrostatic precipitator to interoperate with corresponding railings disposed on opposing interior sides of the cabinet.

15. The electrostatic precipitator of claim 13, wherein the particles comprise zinc whiskers.

16. The electrostatic precipitator of claim 13, wherein at least one of the at least one electronics system comprises a computer system.

17. The electrostatic precipitator of claim 16, wherein said computer system comprises a network server.

18. The electrostatic precipitator of claim 16, wherein the computer is a rack-mount collocation computer.

* * * * *